(12) United States Patent
Jang et al.

(10) Patent No.: US 7,947,984 B2
(45) Date of Patent: May 24, 2011

(54) LIQUID CRYSTAL DISPLAY DEVICE AND METHOD FOR FABRICATING THE SAME

(75) Inventors: Yong Ho Jang, Seongnam-si (KR); Nam Wook Cho, Gunpo-si (KR); Min Doo Chun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1527 days.

(21) Appl. No.: 11/168,571

(22) Filed: Jun. 29, 2005

(65) Prior Publication Data

US 2006/0017681 A1 Jan. 26, 2006

(30) Foreign Application Priority Data

Jun. 30, 2004 (KR) .................. 10-2004-0050516

(51) Int. Cl.
*H01L 29/04* (2006.01)
(52) U.S. Cl. ............... 257/72; 257/59; 257/61; 257/66; 257/E29.273; 257/E29.278; 257/E29.279
(58) Field of Classification Search .................. 257/57, 257/59, 61, 66, 72, E29.116, E29.12, E29.268, 257/E29.273, E29.277–E29.279
See application file for complete search history.

(56) References Cited

U.S. PATENT DOCUMENTS

| | | | | | |
|---|---|---|---|---|---|
| 5,198,379 | A | * | 3/1993 | Adan | 438/151 |
| 5,661,050 | A | * | 8/1997 | den Boer et al. | 438/30 |
| 6,121,660 | A | * | 9/2000 | Yamazaki et al. | 257/348 |
| 2005/0236618 | A1 | * | 10/2005 | Toyoda et al. | 257/52 |

* cited by examiner

*Primary Examiner* — Matthew E Warren
(74) *Attorney, Agent, or Firm* — McKenna Long & Aldridge LLP

(57) ABSTRACT

An LCD device is disclosed, to minimize the signal distortion by decreasing the instability of voltage in a—Si:H TFT of a gate driving signal output unit, which includes a signal controller for outputting first and second control signals Q and /Q; a pull-up transistor between a clock signal terminal CLK and a gate driving signal output terminal for receiving the first control signal Q, the pull-up transistor having a first gate electrode, a first source electrode and a first drain electrode, wherein the pull-up transistor has an asymmetric structure in a first area of the first source electrode overlapped with the first gate electrode and a second area of the first drain electrode overlapped with the first gate electrode; and a pull-down transistor connected between the gate driving signal output terminal and a ground voltage terminal, wherein the pull-down transistor receives the second control signal.

9 Claims, 13 Drawing Sheets

LIQUID CRYSTAL DISPLAY DEVICE AND METHOD FOR FABRICATING THE SAME

The present invention claims the benefit of Korean Application No. P2004-50516, filed on Jun. 30, 2004, which is hereby incorporated by reference for all purposes as if fully set forth herein.

BACKGROUND OF THE INVENTION

1. Field of the Invention

The present invention relates to a liquid crystal display (LCD) device, and more particularly, to an LCD device and a method for fabricating the same, to minimize the signal distortion by decreasing the instability of voltage in a—Si:H TFT of a gate driving signal output unit.

2. Discussion of the Related Art

Demands for various display devices have increased with the growth and popularity of information technology. Accordingly, many efforts have been made to research and develop various flat display devices such as liquid crystal display (LCD), plasma display panel (PDP), electroluminescent display (ELD), and vacuum fluorescent display (VFD). Some species of flat display devices have already been applied to displays for various Among the various flat display devices, liquid crystal display (LCD) devices have been the most widely used due to their advantageous characteristics such as thin profile, light weight, and low power consumption, to the point where LCD devices are a substitute for Cathode Ray Tubes (CRTs). In addition to mobile type LCD devices such as those in notebook computers, LCD devices have been developed for computer monitors and televisions receiving and displaying broadcasting signals.

Hereinafter, a related art LCD device will be described with reference to the accompanying drawings.

FIG. 1 illustrates a layout of a related art LCD device. As illustrated in FIG. 1, the related art LCD device includes an LCD panel 20, a gate driving unit 12, a data driving unit, and a timing controller 16. The LCD panel 20 includes lower and upper substrates 11 and 10, and a liquid crystal layer (not illustrated) formed between the lower and upper substrates. The gate driving unit 12 includes a plurality of gate drivers (12_1, 12_2, ..., 12_n), wherein the plurality of gate drivers are formed on the predetermined portion of the lower substrate 11. Also, the data driving unit 15 includes a plurality of data drivers (15_1, 15_2, ..., 15_m), wherein the plurality of data drivers are connected with a source PCB 14 by a data TCP 13. The timing controller 16 outputs control signals and video data to the gate driving unit 12 and the data driving unit 15.

In addition, a plurality of control signal lines are provided so as to provide the control signals outputted from the timing controller 16 to a gate drive IC 12. The timing controller 16 controls the driving timing of the gate driving unit 12 and the data driving unit 15 with a predetermined clock signal CLK, a gate start signal, and a timing signal.

A plurality of input signal lines are connected with the respective control signal lines, wherein the signals are inputted to the respective gate drivers (12_1, 12_2, ..., 12_n) of the gate driving unit 12 by the input signal lines. Although not illustrated, scanning signals are sequentially outputted to respective gate pads of the lower substrate 11 by the output signal lines of the gate driving unit 12.

In the LCD panel 20, a pixel unit 8 is defined to display the image. Although not illustrated, the lower substrate 11 includes a plurality of gate lines G/L, a plurality of data lines D/L, a plurality of pixel electrodes, and a plurality of thin film transistors TFT. The plurality of gate lines G/L intersect the respective data lines D/L at the right angles, thereby defining a plurality of pixel regions. The plurality of pixel electrodes are respectively formed in the pixel regions defined by the gate lines G/L and the data lines D/L. Also, the plurality of thin film transistors TFTs are formed at the respective intersection points of the gate and data lines, wherein the signals of the data lines D/L are applied to the respective pixel electrodes according to the signals of the gate lines G/L.

The thin film transistor TFT includes a gate electrode, a gate insulating layer, an active layer, a source electrode, and a drain electrode. The gate electrode is protruding from one side of the gate line. The gate insulating layer is formed on an entire surface of the lower substrate 11 including the gate electrode. The active layer is overlapped with the gate electrode. Then, the source electrode is overlapped with one side of the data line and one side of the gate electrode. The drain electrode is formed at the predetermined interval from the source electrode. In addition, an ohmic contact layer is formed between the active layer and the source and drain electrodes. Then, a passivation layer is formed on the entire surface of the substrate including the data line, wherein the passivation layer has a first contact hole in the drain electrode. In this state, the drain electrode is in contact with the pixel electrode by the first contact hole.

Although not illustrated, the upper substrate 10 includes a black matrix layer, a color filter layer and a common electrode. The color filter is coated on the upper substrate 10, wherein the color filter is formed in state of being divided in correspondence with the pixel regions of the lower substrate 11 by the black matrix layer. The common electrode corresponds to the pixel electrode of the lower substrate 11.

According as turn-on signals are sequentially applied to the gate lines, the data signal is applied to the pixel electrode of the corresponding line, thereby displaying the image.

Although not illustrated, the gate driving unit 12 and the data driving unit 15 are formed of a plurality of buffer TFTs. Especially, the buffer TFT of the gate driving unit 12 is formed of a—Si:H TFT.

Hereinafter, a related art gate driving unit having a buffer TFT of a—Si:H TFT will be described with reference to the accompanying drawings.

FIG. 2 is a circuit view of a gate driving unit according to one type of the related art. FIG. 3A is a plane view of a pull-up transistor PU in 'A' area of FIG. 2. FIG. 3B is a cross sectional view of a pull-up transistor PU in 'A' area of FIG. 2. FIG. 4 is an output wave form of explaining the problems of a related art gate driving unit. FIG. 5 is a circuit view of a gate driving unit according to another type of the related art. FIG. 6 is a cross sectional view of a pull-up transistor PU and a capacitor C1 of FIG. 5.

As illustrated in FIG. 2, the related art gate driving unit includes a signal controller 21, and a gate driving signal output unit. The signal controller 21 outputs first and second control signals Q and /Q. The gate driving signal output unit receives the first and second control signals Q and /Q from the signal controller 21, and then outputs the gate signal to the gate line G/L of the pixel unit.

The gate driving signal output unit includes a pull-up transistor PU and a pull-down transistor PD of a—Si:H TFT, wherein the gate driving signal output unit is provided between a clock signal terminal CLK and a ground voltage terminal VSS. The gate driving signal is outputted through an output node 1 N1 between the pull-up transistor PU and the pull-down transistor PD. The pull-up transistor and the pull-down transistor may be turned on and off according to the first and second control signals Q and /Q. The gate driving signal is outputted with the charge of the pull-up transistor and the discharge of the pull-down transistor.

In the aforementioned gate driving signal output unit, the clock signal CLK is applied to one end of the pull-up transistor. In the pull-up transistor, as illustrated in FIG. 3A and FIG. 3B, a gate electrode 31 is formed on the predetermined portion of a substrate 30, and a gate insulating layer 32 is formed on an entire surface of the substrate 30 including the gate electrode 31. Also, an active layer 33 is formed on the gate insulating layer 32 above the gate electrode 31. Then, source and drain electrodes 35a and 35b are formed at both sides of the active layer 33. The overlapped area L1 between the source electrode 35a and the gate electrode 31 is same as the overlapped area L2 between the drain electrode 35b and the gate In addition, an ohmic contact layer 34 is formed between the active layer 33 and the source and drain electrodes 35a and 35b. The active layer 33 is formed of an amorphous silicon layer, and the ohmic contact layer 34 is formed of an n-type amorphous silicon layer.

In this state, the clock signal CLK is applied to the source electrode 35a of the pull-up transistor PU. When the clock signal CLK is periodically applied to the source electrode of the pull-up transistor PU, and the gate electrode of the pull-up transistor PU and the pull-down transistor PD connected with the gate signal output terminal is in the floating state, the first and second control signals Q and /Q are unstable since the clock signal CLK is applied to the source electrode 35a of the pull-up transistor PU. Accordingly, as illustrated in FIG. 4, it may cause an abnormal gate output signal GL which is not synchronized with the first and second control signals Q and /Q.

This is not a significant problem in the initial drive of the gate driving circuit. However, if the pull-up transistor is discharged due to a heated LCD panel, the plurality of gate driving signals are outputted by the clock signal CLK, thereby causing flickering, degrading the picture quality. That is, as illustrated in FIG. 4, on applying the input signal of the first and second control signals Q and /Q, the abnormal gate driving signal is outputted due to the raise of the voltage in the second control signal /Q of the pull-down transistor PD.

Accordingly, in order to solve these problems, as illustrated in FIG. 5 and FIG. 6, a capacitor C1 is additionally provided between the source electrode and the gate electrode of the pull-up transistor PU. That is, as illustrated in FIG. 6, a gate electrode 61 is formed on the predetermined portion of a substrate 60, and a first conductive layer 61a is formed on the same layer as the gate electrode 61. Then, a gate insulating layer 62 is formed on the gate electrode 61 and the first conductive layer 61a. In addition, an active layer 63 is formed on the gate insulating layer 62 above the gate electrode 61. Furthermore, source and drain electrode 64a and 64b are formed at both sides of the active layer 63, wherein the source and drain electrode 64a and 64b are partially overlapped with the gate electrode 61. The drain electrode 64b is formed above the first conductive layer 61a.

After that, an insulating interlayer 65 is formed on the entire surface of the substrate 60 including the source and drain electrodes 64a and 64b. In this case, first and second contact holes are formed to expose the drain electrode 64b above the active layer 64 and the conductive layer 61a. Then, a second conductive layer 66 is formed on the insulating interlayer 65, wherein the second conductive layer 66 is in contact with the drain electrode 64b through the first and second contact holes. Also, an ohmic contact layer 63a is formed between the active layer 63 and the source and drain electrodes 64a and 64b.

In this case, the first conductive layer 61a is extended from the gate electrode 61, wherein the first conductive layer 61 functions as a lower capacitor electrode. Also, the second conductive layer 66 is in contact with the drain electrode 64b through the second contact hole, wherein the second conductive layer 66 functions as an upper capacitor electrode. Thus, the capacitor C1 is additionally formed between each of the first conductive layer 61a, the gate insulating layer 61 and the drain electrode 64b.

However, if the additional capacitor C1 is formed between the source electrode and the gate electrode of the pull-up transistor PU, the size of device increases, so that the integration of device is lowered.

SUMMARY OF THE INVENTION

Accordingly, the present invention is directed to an LCD device and a method for fabricating the same that substantially obviates one or more problems due to limitations and disadvantages of the related art.

An advantage of the present invention is to provide an LCD device and a method for fabricating the same, to minimize the output of abnormal gate driving signal (signal distortion) by decreasing the instability of voltage in a—Si:H TFT of a gate driving signal output unit, when a gate driving unit is provided on a lower substrate of an LCD panel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an LCD device includes a signal controller for outputting first and second control signals Q and /Q; a pull-up transistor between a clock signal terminal CLK and a gate driving signal output terminal for receiving the first control signal Q, the pull-up transistor having a first gate electrode, a first source electrode and a first drain electrode, wherein the pull-up transistor has an asymmetric structure in a first area of the first source electrode overlapped with the first gate electrode and a second area of the first drain electrode overlapped with the first gate electrode; and a pull-down transistor connected between the gate driving signal output terminal and a ground voltage terminal, wherein the pull-down transistor receives the second control signal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, an LCD device and a method for fabricating the same according to the present invention will be described with reference to the accompanying drawings.

Figure 1:
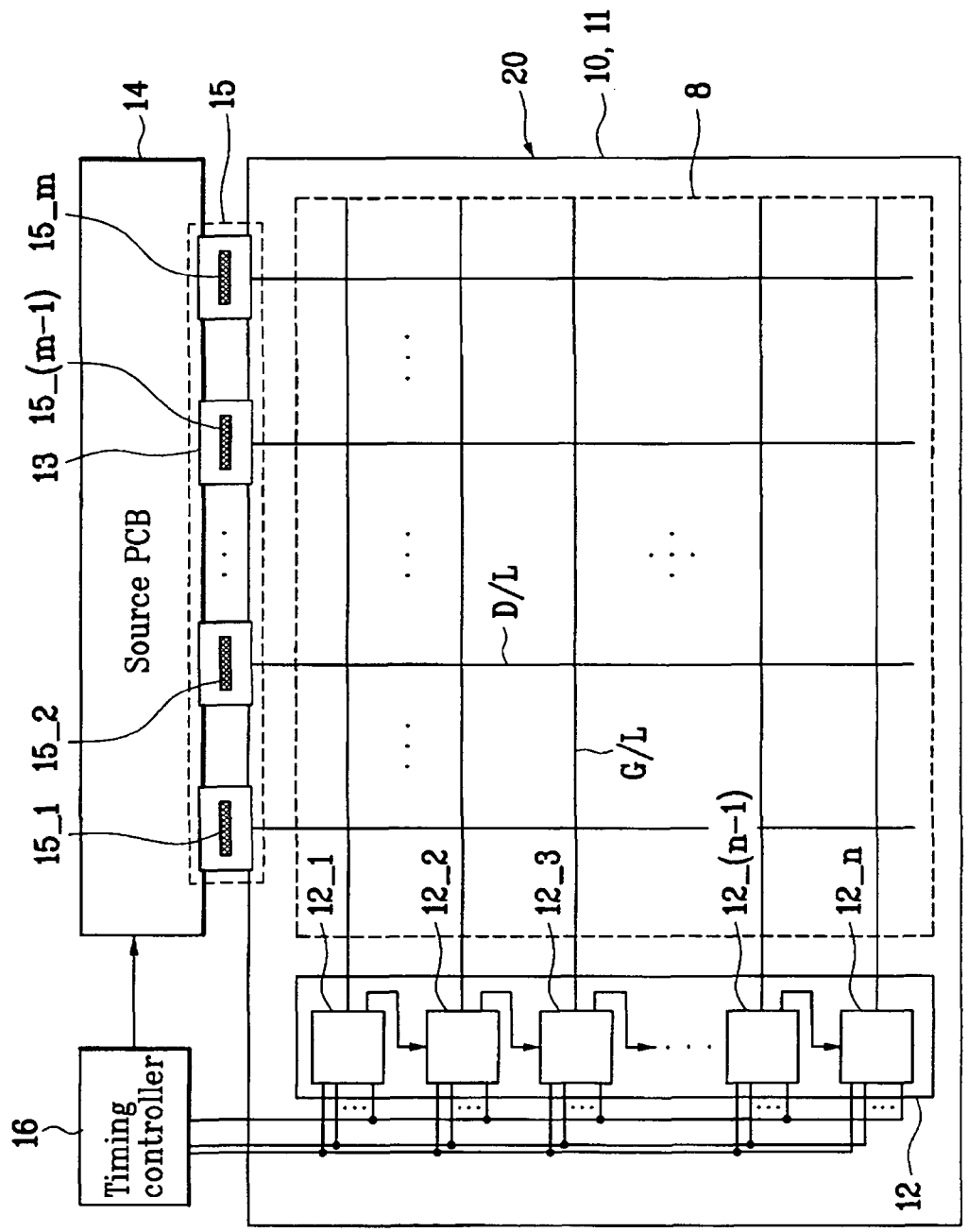
FIG. 1 is a layout of a related art LCD device.
Figure 2:
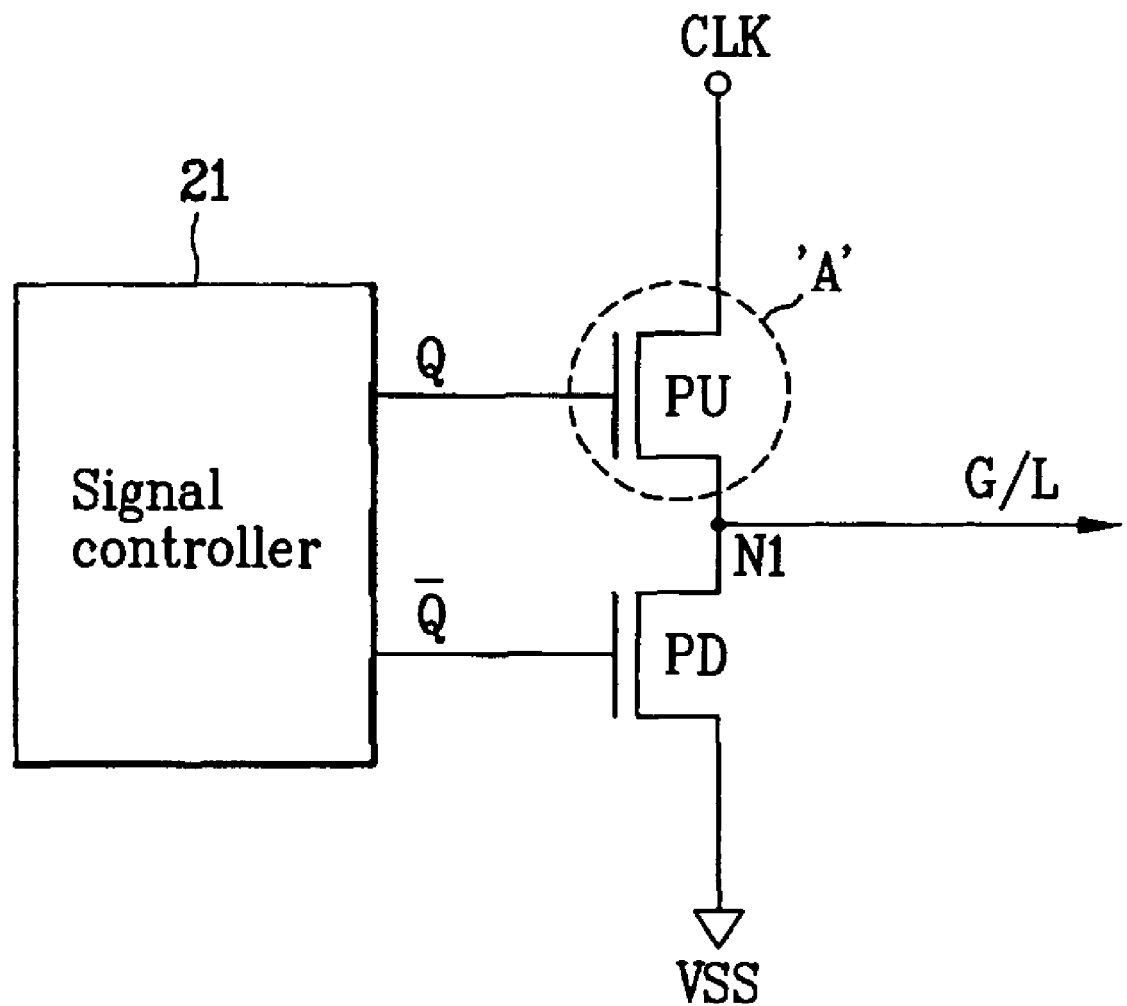
FIG. 2 is a circuit view of a gate driving unit according to one type of the related art.
Figure 3A:
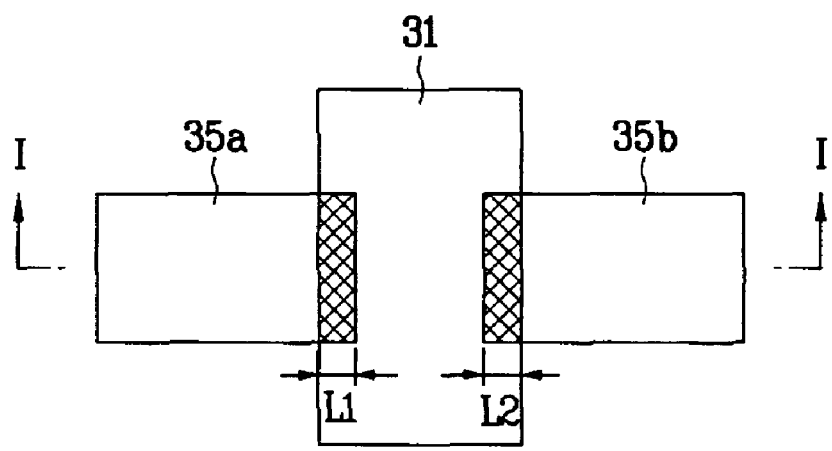
FIG. 3A is a plane view of a pull-up transistor PU of 'A' area in FIG. 2.
Figure 3B:
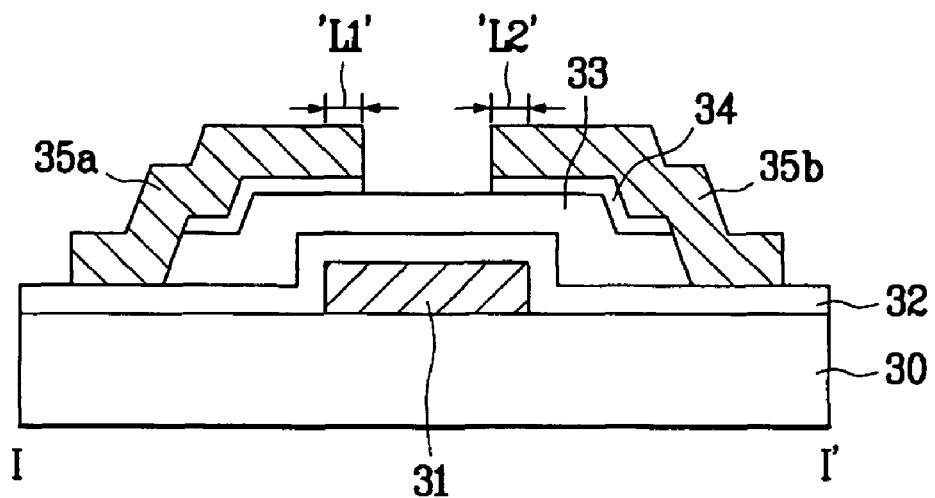
FIG. 3B is a cross sectional view of a pull-up transistor PU of 'A' area in FIG. 2.
Figure 4:
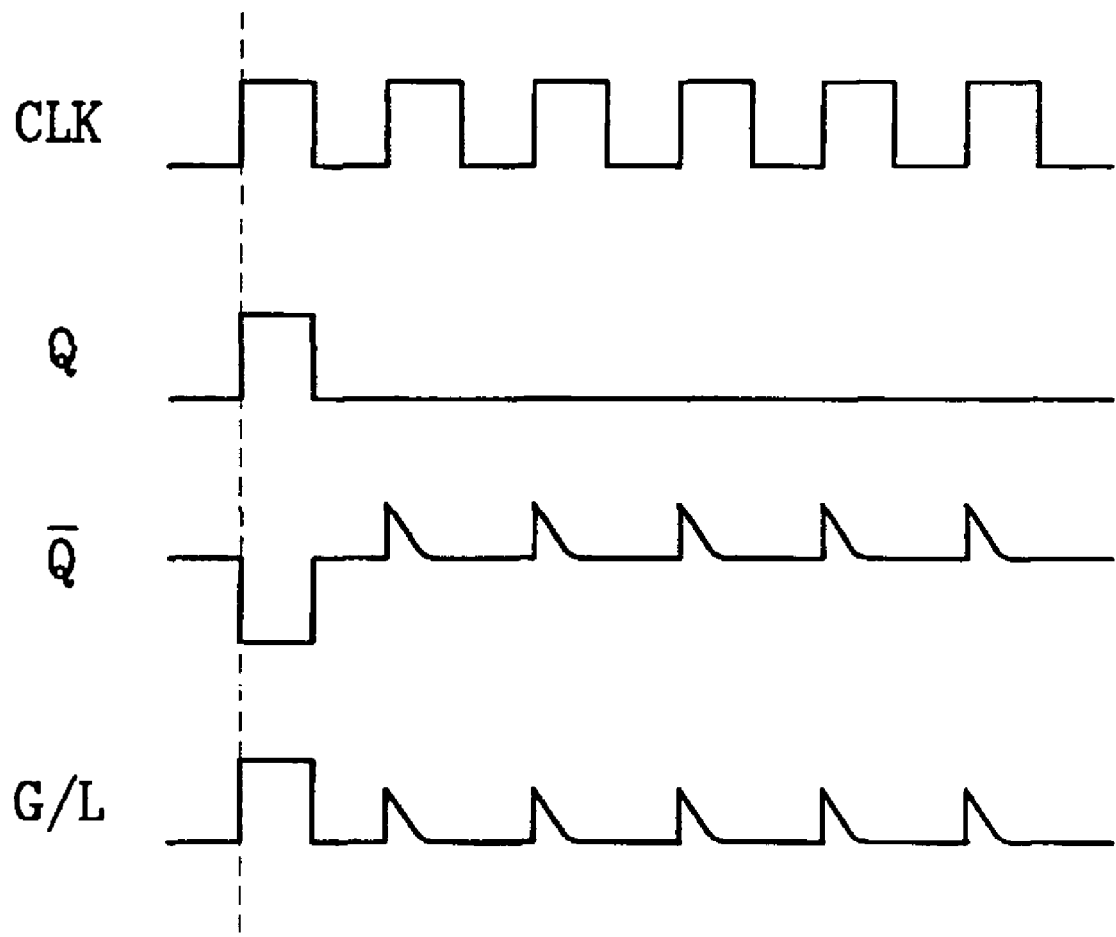
FIG. 4 is an output wave form of explaining the problems of a related art gate driving unit.
Figure 5:
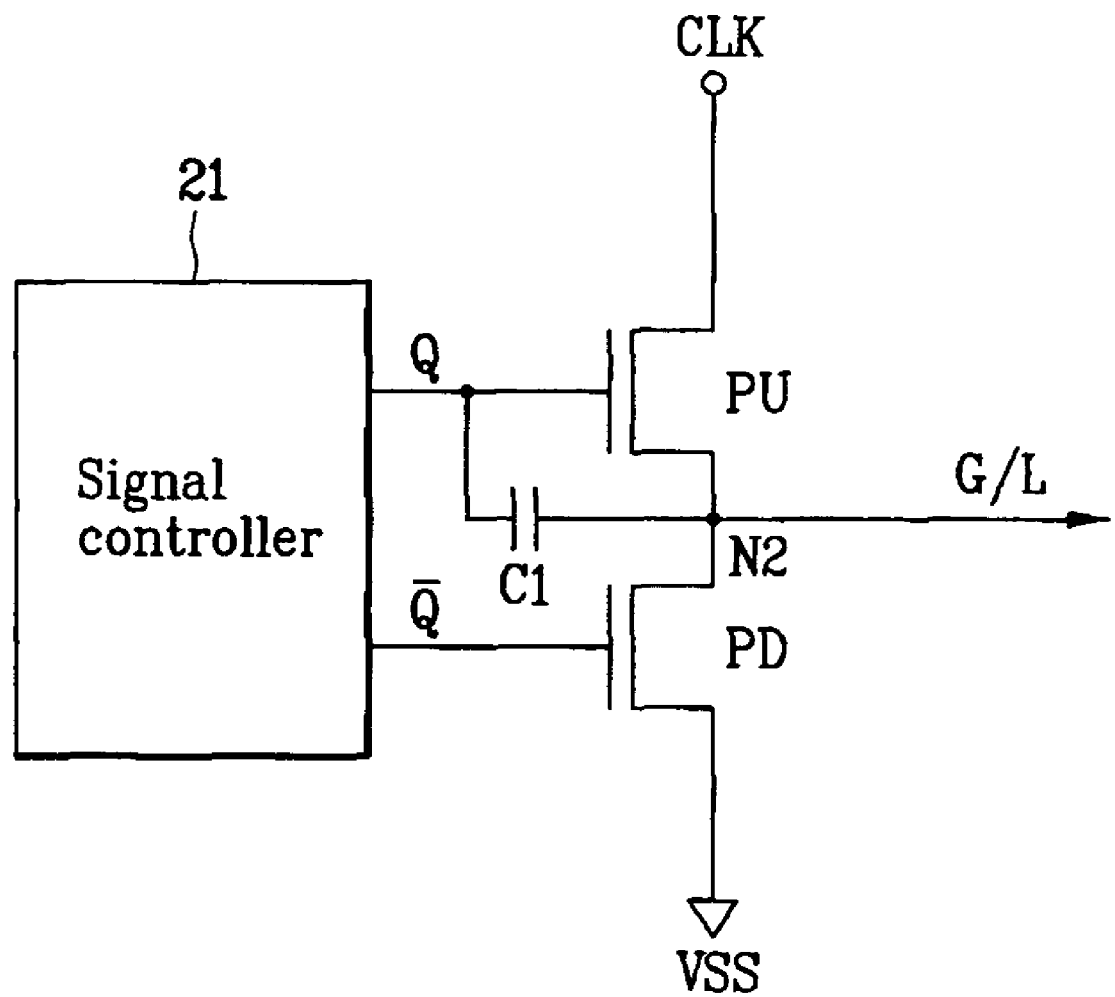
FIG. 5 is a circuit view of a gate driving unit according to another type of the related art.
Figure 6:
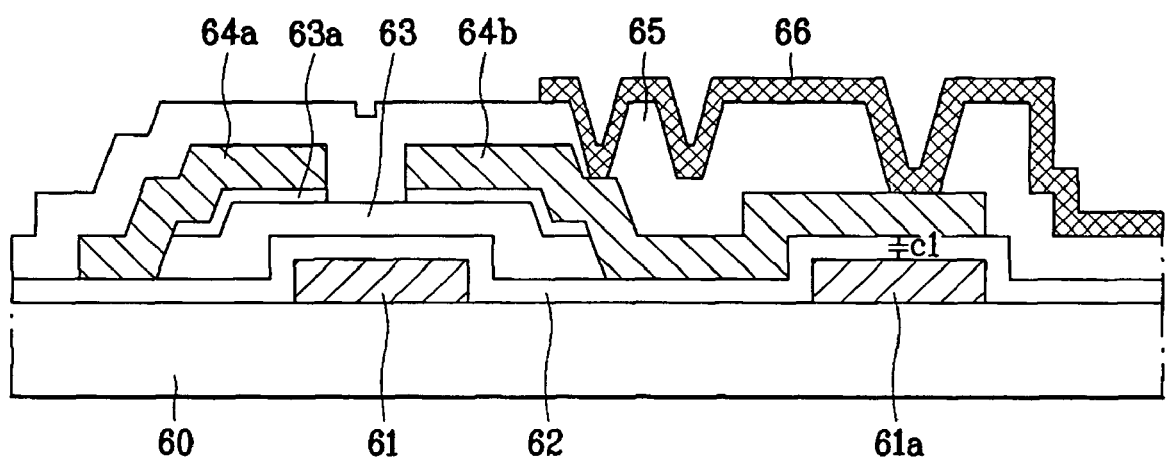
FIG. 6 is a cross sectional view of a pull-up transistor PU and a capacitor C1 of FIG. 5.
Figure 7:
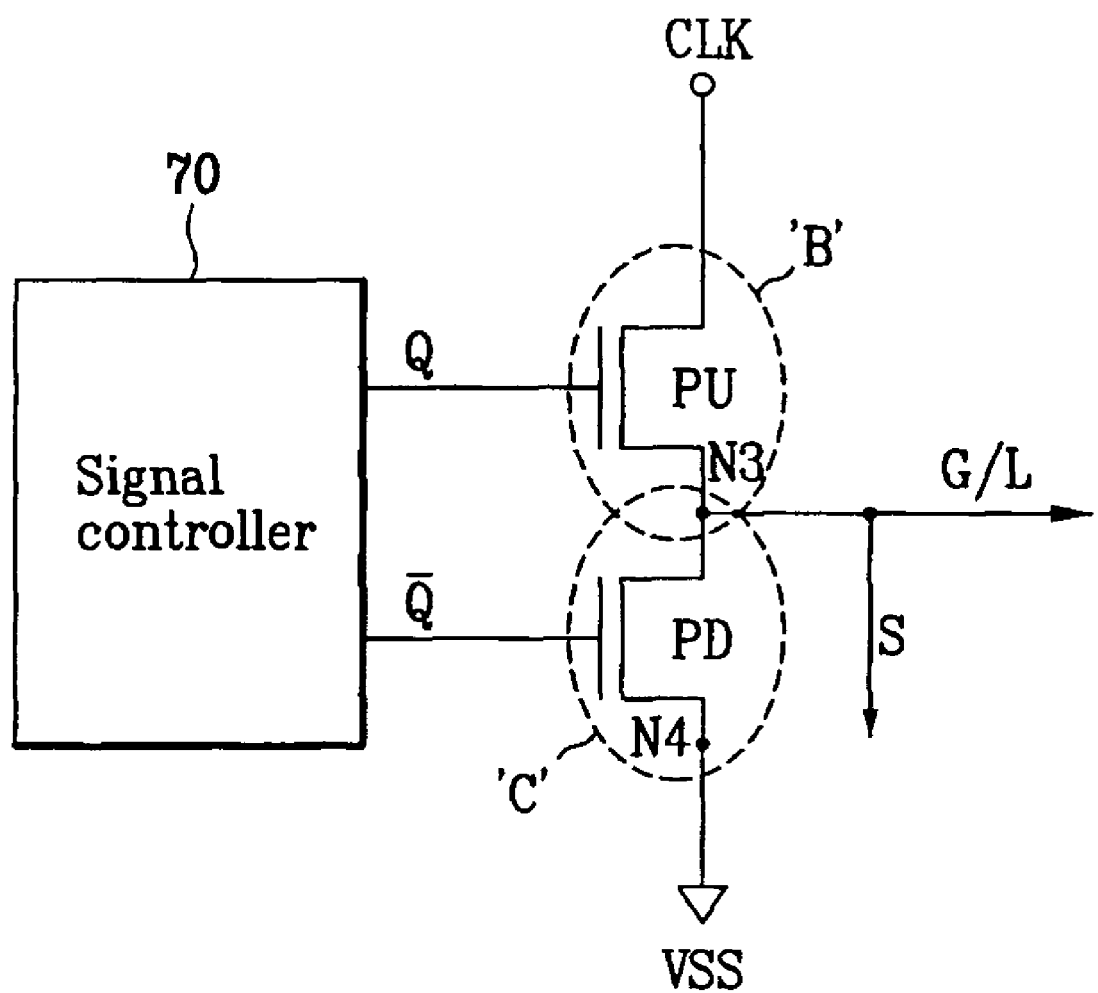
FIG. 7 is a circuit view of a gate driving unit of an LCD device according to one type of the present invention.
Figure 8A:
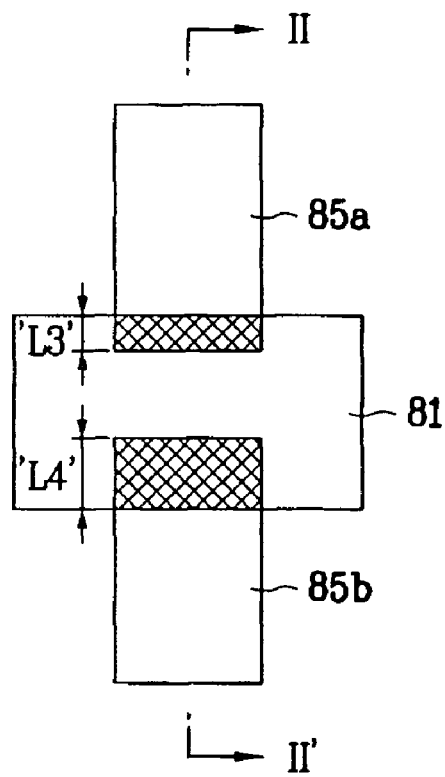
FIG. 8A is a plane view of a pull-up transistor PU of 'B' area of FIG. 7 in an LCD device according to the first embodiment of the present invention.

FIG. 7 is a circuit view of a gate driving unit of an LCD device according to one type of the present invention. FIG. 8A is a plane view of a pull-up transistor PU of 'B' area of FIG. 7 in an LCD device according to the first embodiment of the present invention.

Figure 8B:
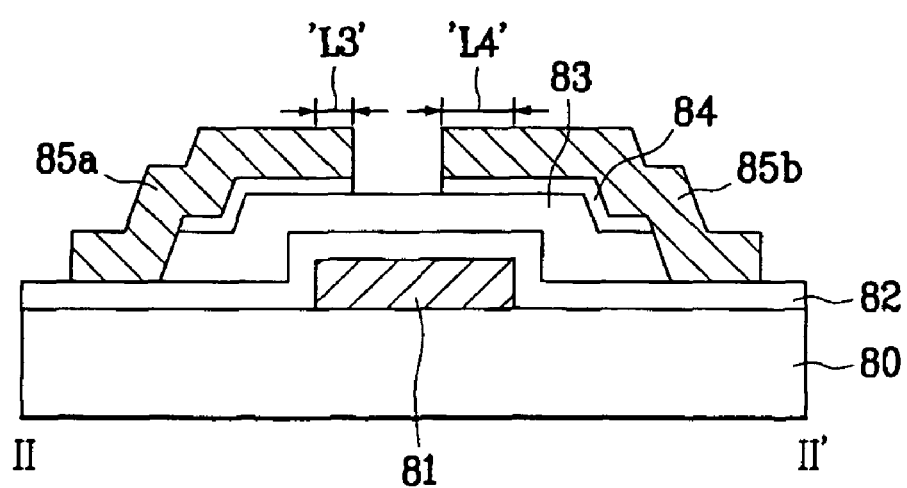
FIG. 8B is a cross sectional view of a pull-up transistor PU of 'B' area of FIG. 7 in an LCD device according to the first embodiment of the present invention.
Figure 9A:
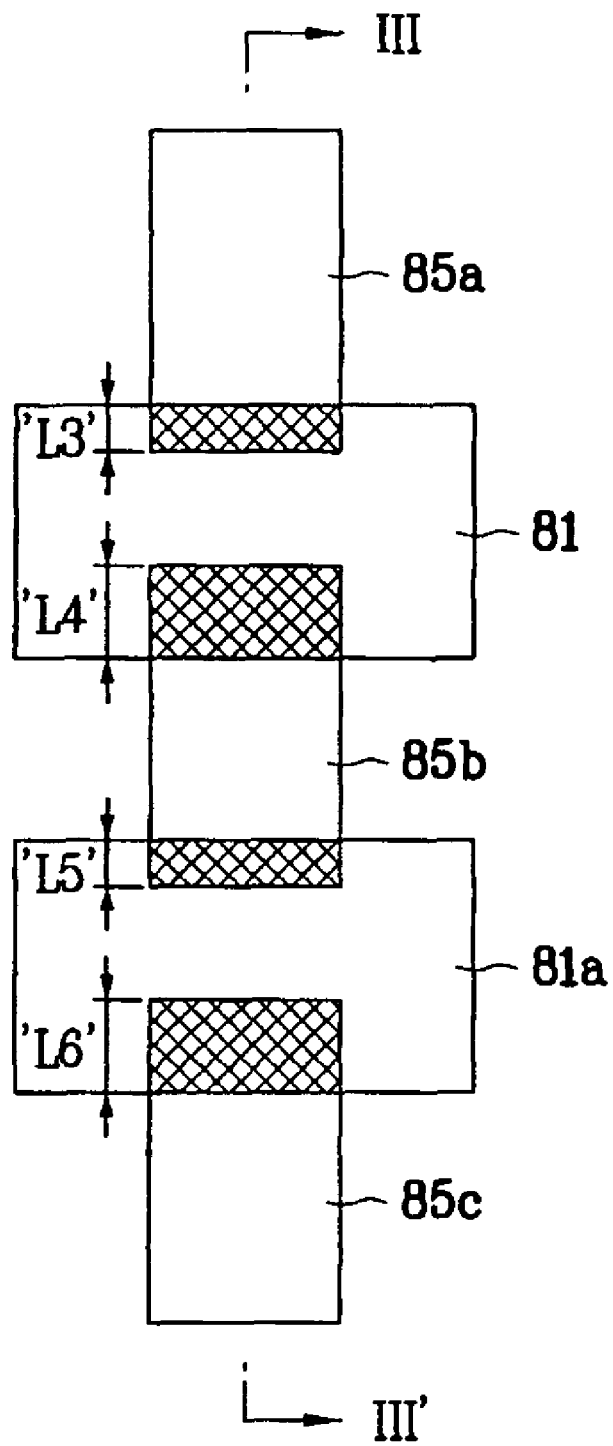
FIG. 9A is a plane view of illustrating 'B' and 'C' areas of FIG. 7 in an LCD device according to the second embodiment of the present invention.
Figure 9B:
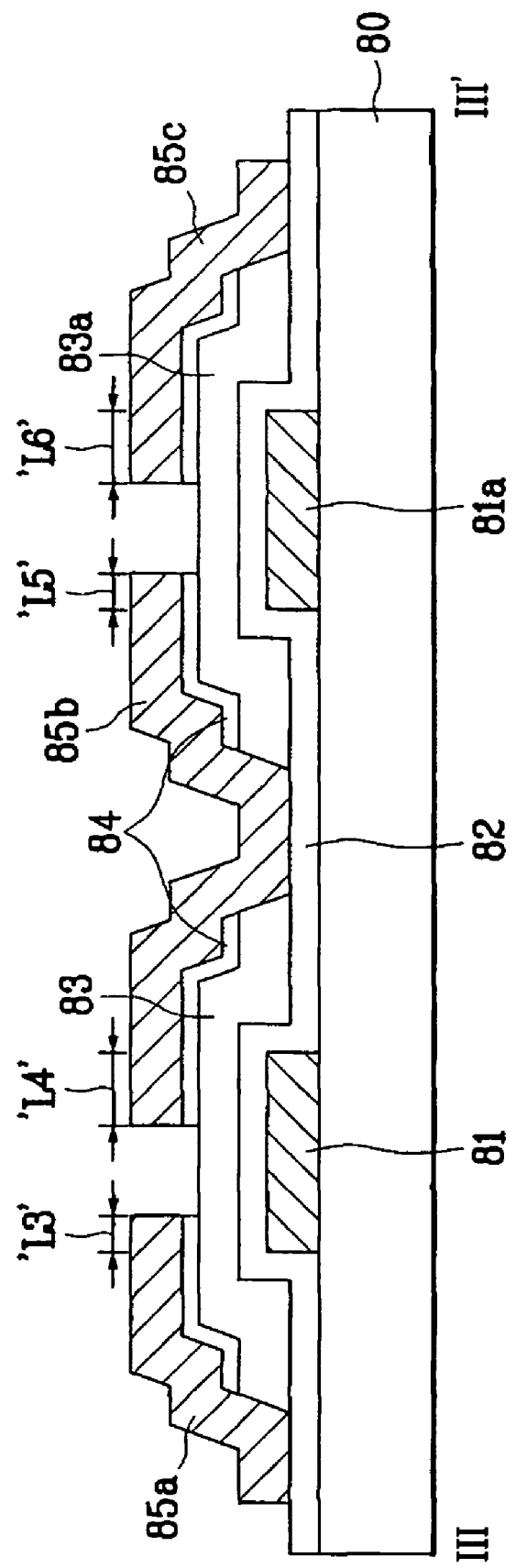
FIG. 9B is a cross sectional view of illustrating 'B' and 'C' areas of FIG. 7 in an LCD device according to the second embodiment of the present invention.
Figure 10:
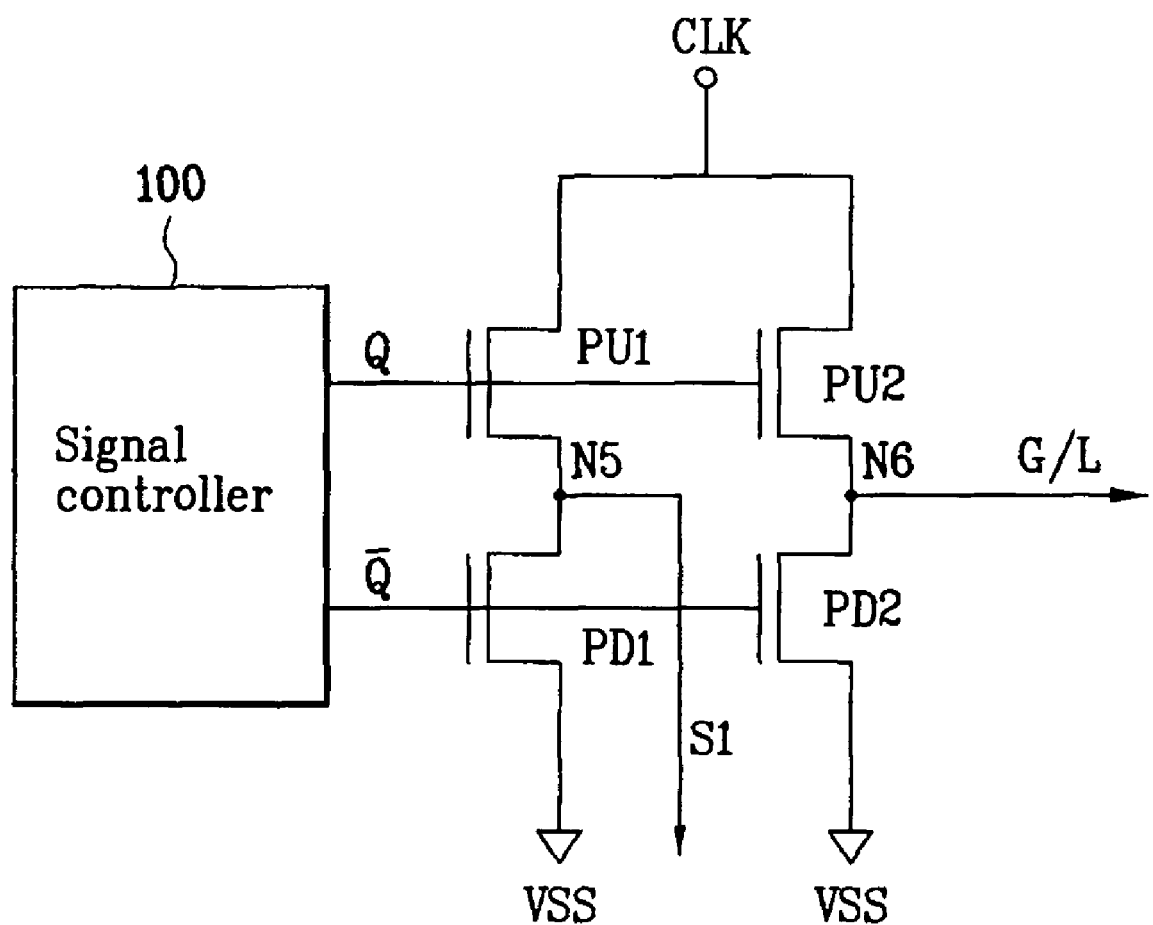
FIG. 10 is a circuit view of a gate driving unit of an LCD device according to another type of the present invention.

FIG. 8B is a cross sectional view of a pull-up transistor PU of 'B' area of FIG. 7 in an LCD device according to the first embodiment of the present invention. FIG. 9A is a plane view of illustrating 'B' and 'C' areas of FIG. 7 in an LCD device according to the second embodiment of the present invention. FIG. 9B is a cross sectional view of illustrating 'B' and 'C' areas of FIG. 7 in an LCD device according to the second embodiment of the present invention. FIG. 10 is a circuit view of a gate driving unit of an LCD device according to another type of the present invention.

First, an LCD device according to the present invention will be described as follows. The LCD device according to the present invention includes an LCD panel 20, a gate driving unit 12, a data driving unit 15, and a timing controller 16. The LCD panel 20 includes lower and upper substrates 11 and 10, and a liquid crystal layer (not illustrated) formed between the lower and upper substrates. The gate driving unit 12 includes a plurality of gate drivers (12_1, 12_2, ..., 12_n), wherein the plurality of gate drivers are formed on the predetermined portion of the lower substrate 11. The data driving unit 15 includes a plurality of data drivers (15_1, 15_2, ..., 15_m), wherein the plurality of data drivers are connected with a source PCB 14 by a data TCP 13. The timing controller 16 outputs control signals and video data to the gate driving unit 12 and the data driving unit 15.

In addition, a plurality of control signal lines are provided to carry the control signals outputted from the timing controller 16 to a gate drive IC 12. The timing controller 16 controls the driving timing of the gate driving unit 12 and the data driving unit 15 with a predetermined clock signal CLK, a gate start signal, and a timing signal.

A plurality of input signal lines are connected with the respective control signal lines, wherein the signals are inputted to the respective gate drivers (12_1, 12_2, ..., 12_n) of the gate driving unit 12 by the input signal lines. Although not illustrated, scanning signals are sequentially outputted to respective gate pads of the lower substrate 11 by the output signal lines of the gate driving unit 12.

In the LCD panel 20, a pixel unit 8 is defined to display the image. Although not illustrated, the lower substrate 11 includes a plurality of gate lines G/L, a plurality of data lines D/L, a plurality of pixel electrodes, and a plurality of thin film transistors TFT. The plurality of gate lines G/L intersect the respective data lines D/L at the right angles, thereby defining a plurality of pixel regions. The plurality of pixel electrodes are respectively formed in the pixel regions defined by the gate lines G/L and the data lines D/L. Also, the plurality of thin film transistors TFTs are formed at the respective intersection points of the gate and data lines, wherein the signals of the data lines D/L are applied to the respective pixel electrodes according to the signals of the gate lines G/L.

The gate driving unit 12 and the data driving unit 15 may be formed of a plurality of buffer TFTs of a—Si:H TFT.

Hereinafter, a gate driving unit having a buffer TFT of a—Si:H TFT according to the present invention will be described with reference to the accompanying drawings.

As illustrated in FIG. 7, the gate driving unit according to the present invention includes a signal controller 70, and a gate driving signal output unit. The signal controller 70 outputs first and second control signals Q and /Q. The gate driving signal output unit receives the first and second control signals Q and /Q from the signal controller 70, and then outputs the gate signal to the gate line G/L of the pixel unit.

The gate driving signal output unit includes a pull-up transistor PU and a pull-down transistor PD of a—Si:H TFT, wherein the gate driving signal output unit is provided between a clock signal terminal CLK and a ground voltage terminal VSS. The gate driving signal is outputted through an output node N3 between the pull-up transistor PU and the pull-down transistor PD. The pull-up transistor and the pull-down transistor may be turned on and off according to the first and second control signals Q and /Q. Also, the gate driving signal is outputted with the charge of the pull-up transistor and the discharge of the pull-down transistor.

The clock signal CLK is consecutively applied to the source electrode of the pull-up transistor through the clock signal terminal without regard to the output of the gate driving signal. In case the clock signal is consecutively applied to the source electrode of the pull-up transistor PU, and the pull-up transistor PU and the pull-down transistor PD connected with the gate signal output terminal are in the floating state, the first and second control signals Q and /Q are unstable due to the apply of the clock signal, so that the abnormal gate output signal, which is not synchronized with the first and second control signals Q and /Q, may be generated.

To solve there problems, in case of the pull-up transistor having the source electrode, to which the clock signal CLK is applied, in the LCD device according to the first embodiment of the present invention, the overlapped area between the gate electrode 81 and the source electrode 85a is asymmetric to the overlapped area between the gate electrode 81 and the drain electrode 85b, as illustrated in FIG. 8A and FIG. 8B, thereby obtaining the different overlap capacitance values.

This will be described in detail below. In the pull-up transistor PU having the clock signal applied to the source electrode thereof, as illustrated in FIG. 8A and FIG. 8B, a gate electrode 81 is formed on a substrate 80, and a gate insulating layer 82 is formed on the entire surface of the substrate 80 including the gate electrode 81.

Then, an active layer 83 is formed on the gate insulating layer 82 above the gate electrode 81. Also, source and drain electrodes 85a and 85b are formed at both sides of the active layer 83, wherein the source and drain electrodes 85a and 85b are overlapped with the gate electrode 81. The overlapped area LC between the source electrode 85a and the gate electrode 81 is different in size from the overlapped area L4 between the drain electrode 85b and the gate electrode 81. That is, the overlapped area L4 between the drain electrode 85b and the gate electrode 81 is about one and a half times as large as the overlapped area L3 between the source electrode 85a and the gate electrode 81.

In addition, an ohmic contact layer 84 is formed between the active layer 83 and the source and drain electrodes 85a and 85b. The active layer 83 is formed of an amorphous silicon layer, and the ohmic contact layer 84 is formed of an n-type amorphous silicon layer.

In the aforementioned LCD device according to the present invention, the overlapped area L4 between the drain electrode 85b and the gate electrode 81 is larger than the overlapped area L3 between the source electrode 85a having the clock signal CLK applied thereto. As a result, the more capacitance is formed between the gate electrode 81 and the drain electrode 85b. For example, when the first capacitor C1 is formed by overlapping the gate electrode 81 with the source electrode 85a, and the second capacitor C2 is formed by overlapping the gate electrode 81 with the drain electrode 85b, the second capacitor C2 is greater than the first capacitor C1. According to the apply of the clock signal CLK, the coupling effect decreases, so that it is possible to prevent the output of the abnormal gate driving signals which are not synchronized with the input signal (first and second control signals).

In the gate driving unit having the gate driving signal output unit of FIG. 7, the pull-down transistor PD as well as the pull-up transistor may have the asymmetric structure in the areas of both ends (node 3 N3 and node 4 N4) overlapped with the gate electrode. That is, as illustrated in FIG. 9A and FIG. 9B, first and second gate electrodes 81 and 81a of the pull-up transistor PU and the pull-down transistor PD are formed in parallel on a substrate 80. Then, a gate insulating layer 82 is formed on the entire surface of the substrate 80 including the first and second gate electrodes 81 and 81a.

After that, first and second active layers 83 and 83a are formed on the gate insulating layer 82 above the respective first and second gate electrodes 81 and 81a. Then, first source and drain electrodes 85a and 85b are formed at both sides of the first active layer 83, wherein the first source and drain electrodes 85a and 85b are overlapped with the first gate electrode 81. Also, second source and drain electrodes 85b and 85c are formed at both sides of the second active layer 83a, wherein the second source and drain electrodes 85b and 85c are overlapped with the second gate electrode 81a. The first drain electrode 85b is formed as one body with the second drain electrode 85b.

The overlapped area L4 between the first drain electrode 85b and the first gate electrode 81 is about one and a half times as large as the overlapped area L3 between the first source electrode 85a and the first gate electrode 81. Also, the overlapped area L6 between the second source electrode 85c and the second gate electrode 81a is about one and a half times as large as the overlapped area L5 between the second drain electrode 85b and the second gate electrode 81.

Each ohmic contact layer 84 is provided between the first active layer 83 and the first source and drain electrodes 85a and 85b, and between the second active layer 83a and the second source and drain electrodes 85b and 85c.

FIG. 9A and FIG. 9B illustrate a number of features, including the overlapped length 'L3' between the first gate electrode 81 and the first source electrode 85a, the overlapped length 'L4' between the first gate electrode 81 and the first drain electrode 85b, the overlapped length 'L5' between the second gate electrode 81a and the second drain electrode 85b, and the overlapped length 'L6' between the second gate electrode 81a and the second source electrode 85c, wherein the overlapped length 'L4' is greater than the overlapped length 'L3', and the overlapped length 'L6' is greater than the overlapped length 'L5'. The overlapped length 'L3' may be same as or different from the overlapped length 'L5'.

A gate driving unit according to another type of the present invention will be described as follows. In the gate driving unit according to another type of the present invention, one pull-up transistor and one pull-down transistor are provided in the last terminal of outputting gate driving signals, and then another pull-up transistor and another pull-down transistor are provided in the prior terminal.

As illustrated in FIG. 10, the gate driving unit includes a signal controller 100, and a gate driving signal output unit. The signal controller 100 outputs first and second control signals Q and /Q. The gate driving signal output unit includes first and second pull-up transistors PU1 and PU2 and first and second pull-down transistors PD1 and PD2. The gate driving signal output unit receives the first and second control signals Q and /Q from the signal controller 100, and then outputs gate signals to gate lines G/L of a pixel unit. The first and second pull-up transistors and the first and second pull-down transistors are formed of a—Si:H TFTs.

The first and second pull-up transistors PU1 and PU2 have gate terminals for receiving the first control signal Q in common, and source terminals for receiving a clock signal CLK in common. The first and second pull-down transistors PD1 and PD2 have gate terminals for receiving the second control signal /Q in common, and source terminals being grounded. Also, drain terminals of the first and second pull-up and pull-down transistors function as output terminals.

In addition, an output node 5 N5 is formed between the first pull-up transistor and the first pull-down transistor. That is, the signal is outputted to the next gate driver through the output node 5 N5. Also, an output node 6 N6 is formed between the second pull-up transistor and the second pull-down transistor. That is, the gate driving signal is outputted to the gate line G/L through the output node N6.

In the aforementioned gate driving signal output unit, the clock signal CLK is applied to each one end of the first and second pull-up transistor PU1 and PU2. In this case, the overlapped area between the first gate electrode and the first drain electrode may be greater than the overlapped area between the first gate electrode and the first source electrode in the first pull-up transistor PU1, or the overlapped area between the second gate electrode and the second drain electrode may be greater than the overlapped area between the second gate electrode and the second source electrode in the second pull-up transistor PU2.

A method for fabricating the LCD device according to the present invention will be described as follows. FIG. 11A to FIG. 11D are cross sectional views of the fabrication process of the LCD device according to the present invention, which explains the fabrication method of a—Si:H TFT in a gate driving signal output unit of a gate driving unit when the gate driving unit is formed on the predetermined portion of a lower substrate of an LCD panel.

Figure 11A:
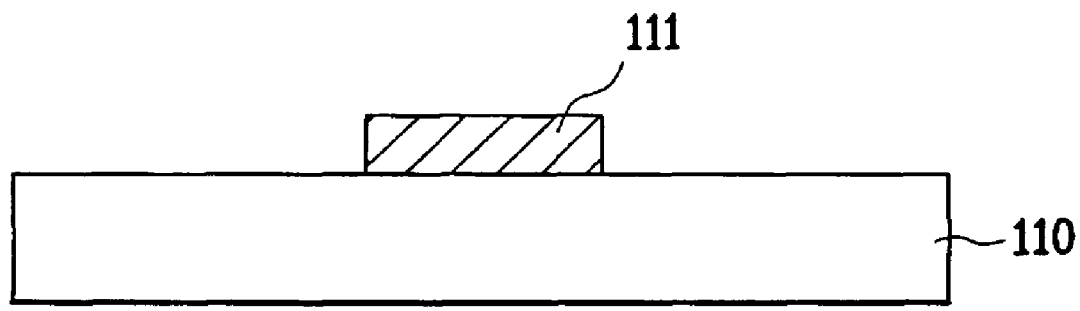
FIG. 11A to FIG. 11D are cross sectional views of the fabrication process of an LCD device according to the present invention.
Figure 11B:
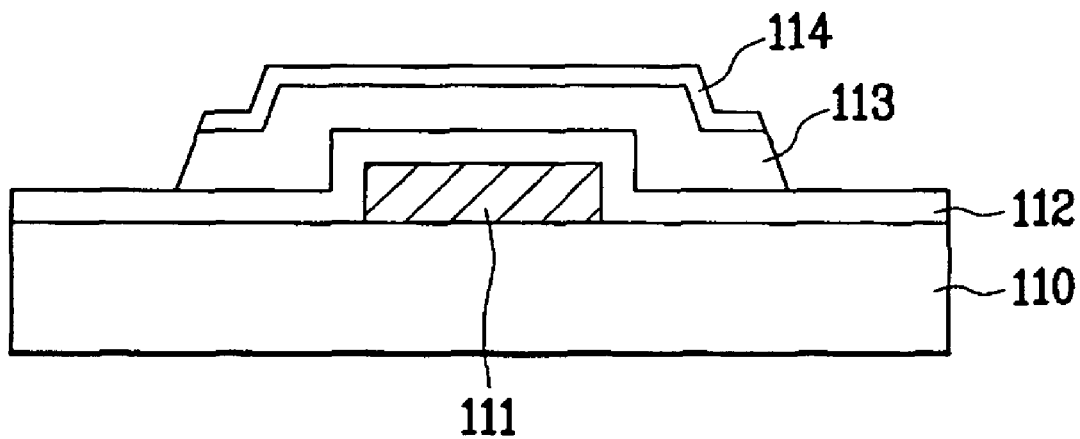

As illustrated in FIG. 11A, a conductive metal layer is deposited on a substrate 110, and then the deposited conductive metal layer is patterned by photolithography, thereby forming a first gate electrode 111. Then, as illustrated in FIG. 11B, a gate insulating layer 112 is formed on the entire surface of the substrate 110 including the first gate electrode 111. The gate insulating layer 112 is formed of a silicon nitride layer $SiN_x$ or a silicon oxide layer $SiO_2$.

After that, first and second semiconductor layers are deposited on the gate insulating layer 112, and then the deposited first and second semiconductor layers are patterned by photolithography, thereby forming an active layer 113 and an ohmic contact layer 114. The active layer 113 and the ohmic contact layer 114 are formed in shape of island above the gate electrode 111. Also, the first semiconductor layer is formed of an amorphous silicon layer, and the second semiconductor layer is formed of an n-type amorphous silicon layer.

Figure 11C:
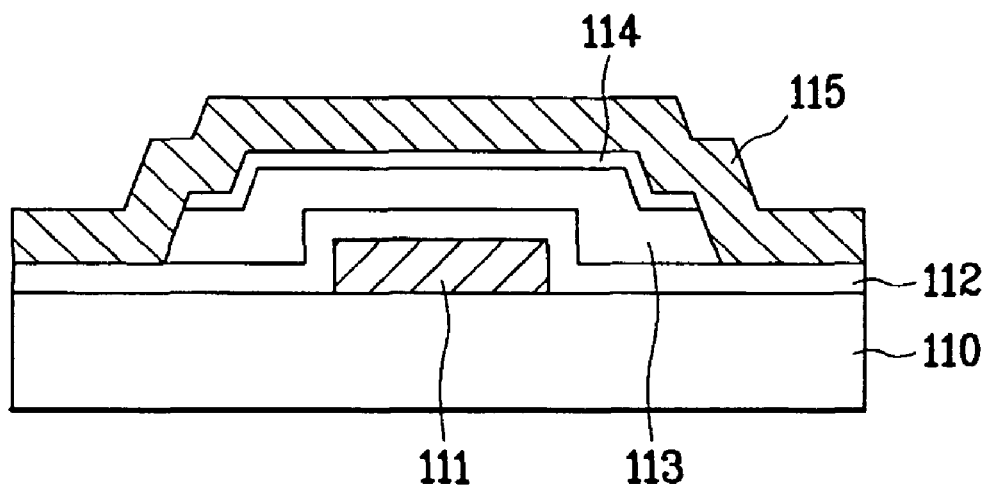
Figure 11D:
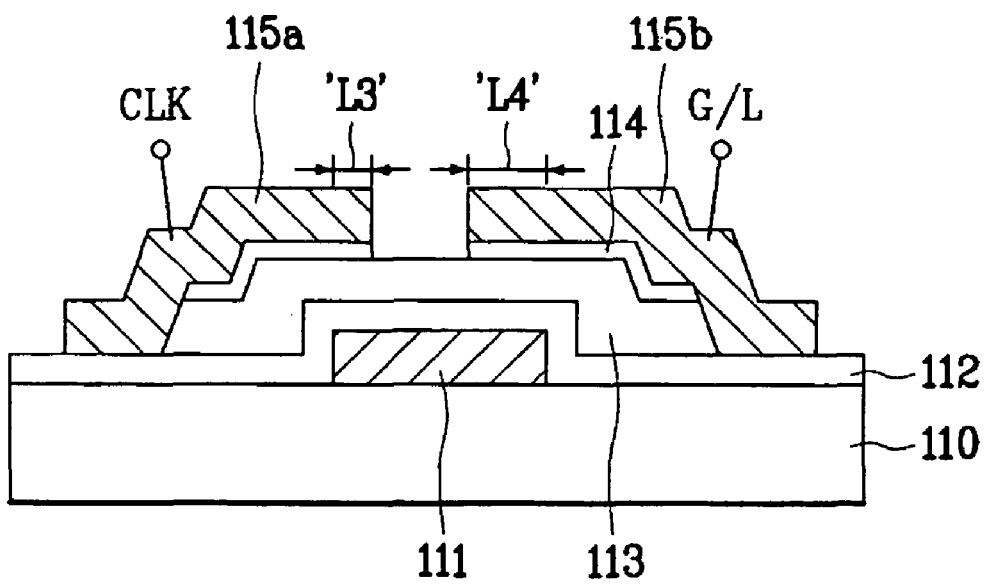

As illustrated in FIG. 11C, a conductive metal layer 115 is deposited on the entire surface of the substrate 110 including the active layer 113 and the ohmic contact layer 114. Subsequently, as illustrated in FIG. 11D, the deposited conductive metal layer 115 is patterned by photolithography, thereby forming source and drain electrodes 115a and 115b. The source electrode 115a is overlapped with one side of the gate electrode 111, wherein the overlapped area between the source electrode 115a and the gate electrode 111 corresponds to a first area. Also, the drain electrode 115b is overlapped with the other side of the gate electrode 111, wherein the overlapped area between the drain electrode 115b and the gate electrode 111 corresponds to a second area. The second area is about one and a half times or more as large as the first area.

The source electrode 115a is connected with a clock signal applying terminal, and the drain electrode 115b is connected with a gate output terminal G/L of outputting the gate driving signal.

The aforementioned fabrication process may be applicable to the pull-up and pull-down transistors of FIG. 8A, FIG. 8B, FIG. 9A, FIG. 9B and FIG. 10.

As mentioned above, the LCD device and the method for fabricating the same according to the present invention has the following advantages.

In the pull-up transistor connected with the clock signal terminal, the overlap capacitance is asymmetrically formed between the gate electrode and the drain electrode and between the gate electrode and the source electrode. Accordingly, it is possible to prevent the output of the abnormal gate driving signals which are not synchronized with the input signal in the floating state.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A liquid crystal display (LCD) device, comprising:
    a signal controller for outputting first and second control signals Q and /Q;
    a pull-up transistor between a clock signal terminal CLK and a gate driving signal output terminal for receiving the first control signal Q, the pull-up transistor having a gate electrode, a source electrode and a drain electrode, wherein the pull-up transistor has an asymmetric structure in a first area of the source electrode overlapped with the gate electrode and a second area of the drain electrode overlapped with the gate electrode so that a first capacitor overlapping the gate electrode with the source electrode is different from a second capacitor overlapping the gate electrode with the drain electrode; and
    a pull-down transistor connected between the gate driving signal output terminal and a ground voltage terminal, wherein the pull-down transistor receives the second control signal,
    wherein each of the source and drain electrodes has a single layer.

2. The LCD device of claim 1, wherein the first area is smaller than the second area.

3. The LCD device of claim 2, wherein the second area is about one and a half times as large as the first area.

4. The LCD device of claim 1, wherein the pull-up transistor and the pull-down transistor are a—Si:H TFTs.

5. The LCD device of claim 1, wherein the pull-down transistor includes a gate electrode for receiving the second control signal /Q, a drain electrode connected with the gate driving signal output terminal, and a source electrode connected with a grounding terminal, and a third area of the drain electrode overlapped with the gate electrode is smaller than a fourth area of the source electrode overlapped with the gate electrode.

6. The LCD device of claim 5, wherein the fourth area is about one and a half times as large as the third area.

7. The LCD device of claim 1, wherein the pull-up transistor includes:
    the gate electrode formed on a lower substrate;
    a gate insulating layer on the lower substrate including the gate electrode;
    a first active layer on the gate insulating layer above the gate electrode;
    the source electrode formed on one side of the first active layer, wherein the source electrode is overlapped with the gate electrode corresponding to the first area; and
    the drain electrode formed on the other side of the first active layer, wherein the drain electrode is overlapped with the gate electrode corresponding to the second area.

8. The LCD device of claim 7, further comprising an ohmic contact layer between the first active layer and the source and drain electrodes.

9. The LCD device of claim 8, wherein the first active layer is formed of an amorphous silicon layer, and the ohmic contact layer is formed of an n-type amorphous silicon layer.

* * * * *